United States Patent
Lin et al.

(10) Patent No.: US 10,452,535 B2
(45) Date of Patent: Oct. 22, 2019

(54) METHOD FOR REUSING DESTINATION BLOCK RELATED TO GARBAGE COLLECTION IN MEMORY DEVICE, ASSOCIATED MEMORY DEVICE AND CONTROLLER THEREOF, AND ASSOCIATED ELECTRONIC DEVICE

(71) Applicant: Silicon Motion Inc., Hsinchu County (TW)

(72) Inventors: Wen-Sheng Lin, Kaohsiung (TW); Sung-Yen Hsieh, New Taipei (TW)

(73) Assignee: Silicon Motion Inc., Hsinchu County (TW)

( * ) Notice: Subject to any disclaimer, the term of this patent is extended or adjusted under 35 U.S.C. 154(b) by 0 days.

(21) Appl. No.: 16/019,532

(22) Filed: Jun. 26, 2018

(65) Prior Publication Data

US 2019/0220392 A1    Jul. 18, 2019

(30) Foreign Application Priority Data

Jan. 15, 2018 (TW) .............................. 107101357 A (51) Int. Cl.
*G06F 12/02* (2006.01)
*G06F 12/1009* (2016.01)
(Continued)

(52) U.S. Cl.
CPC ...... *G06F 12/0246* (2013.01); *G06F 11/1435* (2013.01); *G06F 11/1441* (2013.01);
(Continued)

(58) Field of Classification Search
CPC ....... G06F 2212/702; G06F 2212/7205; G06F 12/0246–0276
See application file for complete search history.

(56) References Cited

U.S. PATENT DOCUMENTS 9,691,485 B1 * 6/2017 Kumar ................. G11C 16/105
9,747,202 B1 * 8/2017 Shaharabany ...... G06F 12/0253
(Continued)

FOREIGN PATENT DOCUMENTS

TW    200519595    6/2005
TW    200821909    5/2008

OTHER PUBLICATIONS

Che-Wei Tsao, Yuan-Hao Chang, Ming-Chang Yang, Po-Chun Huang, Efficient Victim Block Selection for Flash Storage Devices, IEEE Transactions on Computers, vol. 64, No. 12, Dec. 2015. (Year: 2015).*

*Primary Examiner* — Khoa D Doan
(74) *Attorney, Agent, or Firm* — Winston Hsu (57) ABSTRACT

A method for reusing a destination block related to garbage collection (GC) in a memory device, the associated memory device and the controller thereof, and the associated electronic device are provided. The method may include: when writing any page of a subset of a plurality of pages of the destination block in a GC procedure, writing valid data and source information into a data region and a spare region of the page, respectively, wherein a power-off event occurs during writing the destination block; after the power-off event ends, performing empty-page search in the destination block to find the last valid page within the destination block; and writing a set of subsequent valid data obtained from the source block into a subsequent page within the destination block, to reuse the destination block.

20 Claims, 7 Drawing Sheets

(51) Int. Cl.
*G06F 11/14* (2006.01)
*G11C 16/30* (2006.01)
*G11C 8/08* (2006.01)
*G11C 8/14* (2006.01)

(52) U.S. Cl.
CPC ...... *G06F 12/0253* (2013.01); *G06F 12/1009* (2013.01); *G11C 8/08* (2013.01); *G11C 8/14* (2013.01); *G11C 16/30* (2013.01); *G06F 2212/7201* (2013.01); *G06F 2212/7205* (2013.01)

(56) References Cited

U.S. PATENT DOCUMENTS

| | | | |
|---|---|---|---|
| 2006/0153025 A1* | 7/2006 | Iida | G06F 12/0246 369/47.1 |
| 2008/0027905 A1 | 1/2008 | Jensen | |
| 2008/0148129 A1 | 6/2008 | Moon | |
| 2011/0214039 A1 | 9/2011 | Steiner | |
| 2012/0297248 A1* | 11/2012 | Bennett | G06F 12/0246 714/16 |
| 2013/0067146 A1* | 3/2013 | Zettsu | G06F 12/02 711/103 |
| 2013/0151892 A1* | 6/2013 | Huang | G06F 12/0246 714/14 |
| 2016/0092128 A1* | 3/2016 | Jain | G06F 3/0619 711/103 |
| 2016/0343448 A1* | 11/2016 | Gueta | G11C 7/24 |
| 2016/0371145 A1* | 12/2016 | Akutsu | G06F 3/0619 |
| 2018/0137187 A1* | 5/2018 | Brodt | G06F 16/214 |
| 2018/0307496 A1* | 10/2018 | Ke | G06F 11/2268 |
| 2019/0095123 A1* | 3/2019 | Lin | G06F 3/0647 |

\* cited by examiner

METHOD FOR REUSING DESTINATION BLOCK RELATED TO GARBAGE COLLECTION IN MEMORY DEVICE, ASSOCIATED MEMORY DEVICE AND CONTROLLER THEREOF, AND ASSOCIATED ELECTRONIC DEVICE

BACKGROUND OF THE INVENTION

1. Field of the Invention

The present invention relates to an access control of a flash memory, more particularly, to a method for reusing a destination block related to garbage collection (GC) in a memory device, the associated memory device and the controller thereof, and the associated electronic device.

2. Description of the Prior Art

Developments in memory technology have enabled the wide application of portable or non-portable memory devices (e.g. memory cards conforming to SD/MMC, CF, MS, XD and UFS specifications; and embedded storage device conforming to UFS and EMMC specifications). Improving access control of memories in these memory devices remains an issue to be solved in the art.

NAND flash memories may comprise single level cell (SLC) and multiple level cell (MLC) flash memories. In an SLC flash memory, each transistor used as a memory cell may have either of two electrical charge values, which may represent logic values 0 and 1, respectively. In comparison, the storage ability of each transistor used as a memory cell in an MLC flash memory may be fully utilized. The transistor in the MLC flash memory can be driven by a voltage higher than that in the SLC flash memory, and different voltage levels can be utilized to record information of at least two bits (e.g. 00, 01, 11, or 10). In theory, the recording density of the MLC flash memory may reach at least twice the recording density of the SLC flash memory, and is therefore preferred by manufacturers of NAND flash memories.

The lower cost and larger capacity of the MLC flash memory means it is more likely to be applied in memory devices than an SLC flash memory. The MLC flash memory does have instability issues, however. To ensure that access control of the flash memory in the memory device meets required specifications, a controller of the flash memory is configured to apply management mechanisms for properly managing data access.

Even memory devices with the above management mechanism will have certain deficiencies, however. For example, as erasing one or more blocks of the flash memory is time consuming, when needed, the memory device may arrange data through a garbage collection (GC) mechanism in background, and then erase blocks, to prevent hindering use of users. Such memory device typically relies on an external power source for operation. When a sudden power-off occurs, a GC operation may not be completed, and may be unexpectedly interrupted. Afterward, when power of the external power source is recovered, the memory device may be forced to re-perform previous tasks that have already been completed in the GC operation. For example, when the sudden power-off occurs, the memory device may have already collected most of the data desired to be kept (e.g. collected to a block), wherein the memory device may be forced to re-collect the aforementioned most of the data desired to be kept (e.g. to collect to another block). With the developments of related technologies, the size of blocks becomes larger and larger, which may cause the aforementioned problem to become more severe. In addition, provided that power of the external power source is unstable, for example, the sudden power-off occurs several times, and blank blocks for storing the data desired to be kept may run out quickly, which may cause collapse of the GC mechanism. Hence, there is a need for a novel method and associated architecture to improve performance of memory devices without introducing side effects or in a way that is less likely to introduce side effects.

SUMMARY OF THE INVENTION

An objective of the present invention is to provide a method for reusing a destination block related to garbage collection (GC) in a memory device, an associated memory device and controller thereof, and an associated electronic device, in order to solve aforementioned problems.

Another objective of the present invention is to provide a method for reusing a destination block related to GC in a memory device, an associated memory device and controller thereof, and an associated electronic device, in order to improve performance of memory devices without introducing side effects or in a way that is less likely to introduce side effects.

At least one embodiment of the present invention provides a method for reusing a destination block related to GC in a memory device, wherein the memory device comprises a non-volatile (NV) memory, and the NV memory comprises at least one NV memory element. The method may comprise: when writing any page of a subset of a plurality of pages of the destination block in a GC procedure, writing valid data and source information into a data region and a spare region of the page, respectively, wherein a power-off event occurs during writing the destination block, the source information indicates a source location of the valid data, the source location is located in one or more source blocks, the power-off event interrupts valid data collection of the memory device from a source block of the one or more source blocks to the destination block, and a plurality of blocks within the at least one NV memory element comprises the one or more source blocks and the destination block; after the power-off event ends, performing empty-page search in the destination block to find a last valid page within the destination block; and writing a set of subsequent valid data obtained from the source block into a subsequent page within the destination block to reuse the destination block.

At least one embodiment of the present invention provides a memory device that may comprise: a NV memory, arranged for storing information, wherein the NV memory comprises at least one NV memory element; and a controller, coupled to the NV memory, arranged for controlling at least one operation of the memory device. The controller may comprise a processing circuit. For example, the processing circuit may control the controller according to a command from a host device, to allow the host device to access the NV memory through the controller. In addition, under control of the processing circuit, the controller may perform following operations: when writing any page of a subset of a plurality of pages of a destination block in a GC procedure, writing valid data and source information into a data region and a spare region of the page, respectively, wherein a power-off event occurs during writing the destination block, the source information indicates a source location of the valid data, the source location is located in one or more source blocks, the power-off event interrupts valid data collection of the memory device from a source block of the one or more source blocks to the destination block, and a plurality of blocks within the at least one NV memory element comprises the one or more source blocks and the destination block; after the power-off event ends, performing empty-page search in the destination block to find a last valid page within the destination block; and writing a set of subsequent valid data obtained from the source block into a subsequent page within the destination block to reuse the destination block.

According to some embodiments, the present invention further provides an electronic device that may comprise the aforementioned memory device and further comprise: the host device, coupled to the memory device. The host device may comprise: at least one processor, arranged for controlling operations of the host device; and a power supply circuit, coupled to the at least one processor, arranged for supplying power to the at least one processor and the memory device. In addition, the memory device may be arranged for providing storage space to the host device.

At least one embodiment of the present invention provides a controller of a memory device, wherein the memory device comprises the controller and a NV memory, and the NV memory comprises at least one NV memory element. The controller may comprise a processing circuit. For example, the processing circuit may control the controller according to a command from a host device, to allow the host device to access the NV memory through the controller. In addition, under control of the processing circuit, the controller may perform following operations: when writing any page of a subset of a plurality of pages of a destination block in a GC procedure, writing valid data and source information into a data region and a spare region of the page, respectively, wherein a power-off event occurs during writing the destination block, the source information indicates a source location of the valid data, the source location is located in one or more source blocks, the power-off event interrupts valid data collection of the memory device from a source block of the one or more source blocks to the destination block, and a plurality of blocks within the at least one NV memory element comprises the one or more source blocks and the destination block; after the power-off event ends, performing empty-page search in the destination block to find a last valid page within the destination block; and writing a set of subsequent valid data obtained from the source block into a subsequent page within the destination block to reuse the destination block.

One of advantages of the present invention is that the present invention method and architecture can properly control operations regarding the memory device, to shorten time of sudden power-off recovery (SPOR) of the memory device, wherein the memory device can quickly reuse the destination block. In addition, implementing according to the embodiments of the present invention will not greatly increase additional costs. Therefore, problems existing in the related arts can be solved without greatly increasing the overall cost. In comparison with the related art, the present invention can achieve optimal performance of memory devices without introducing side effects or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

I. Memory System

Figure 1:
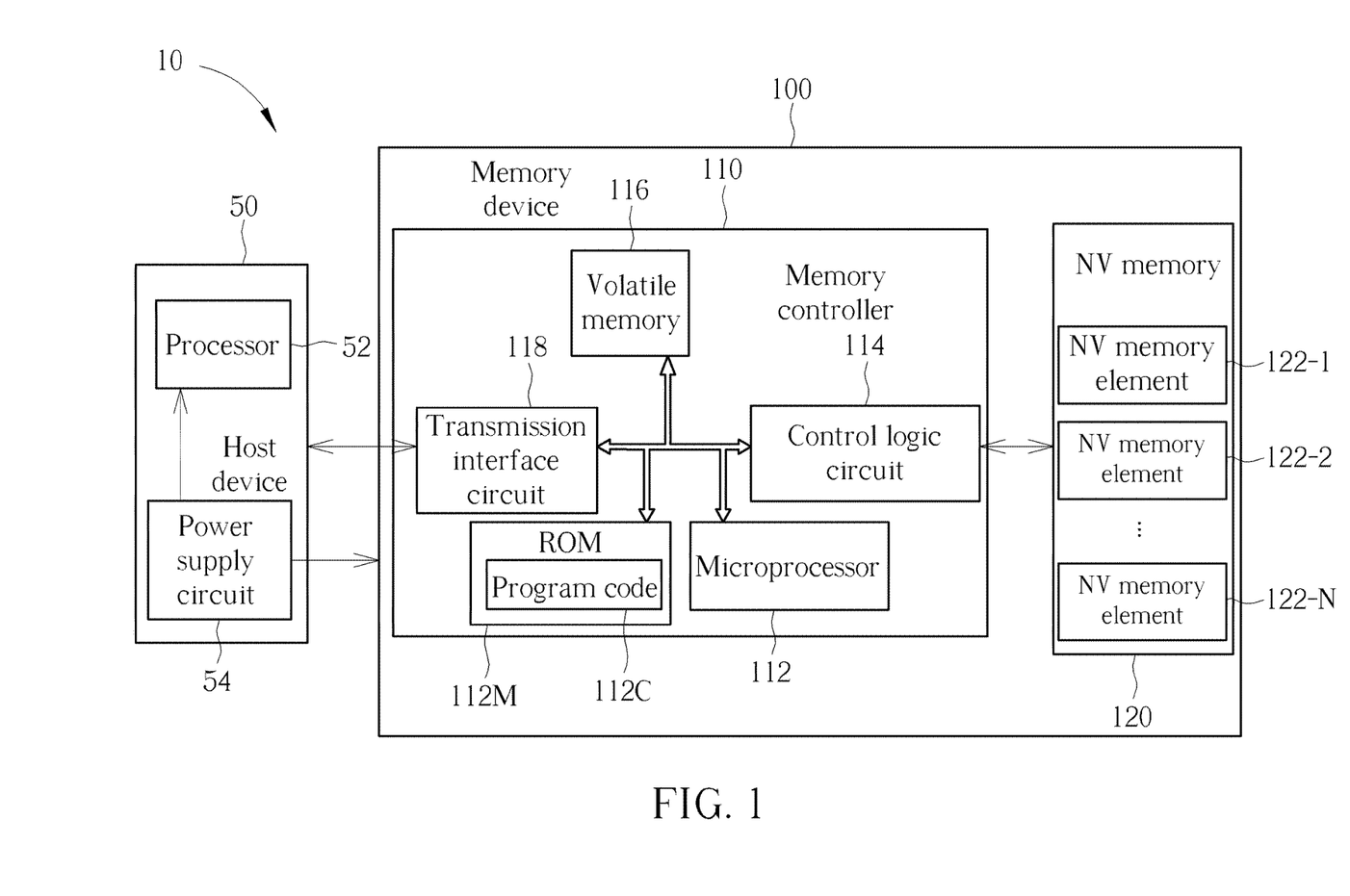
FIG. 1 is a diagram illustrating an electronic device according to an embodiment of the present invention.

FIG. 1 is a diagram illustrating an electronic device 10 according to an embodiment of the present invention, where the electronic device 10 comprises a host device 50 and a memory device 100. The host device 50 may comprise: at least one processor 52 (e.g. one or more processors), arranged for controlling operation of the host device 50; and a power supply circuit 54, coupled to the aforementioned at least one processor 52, arranged for supplying power to the at least one processor 52 and the memory device 100, and outputting one or more driving voltages to the memory device 100, where the memory device 100 may be arranged for providing storage space to the host device 50, and the memory device 100 may obtain the one or more driving voltages from the host device 50 as a power source of the memory device 100. Examples of the host device 50 may include, but are not limited to: a multifunctional mobile phone, a tablet, a wearable device and a personal computer (e.g. a desktop computer or a laptop computer). Examples of the memory device 100 may include, but are not limited to: a portable memory device (e.g. a memory card conforming to the SD/MMC, CF, MS, XD or UFS specification), a solid state drive (SSD), or various types of embedded storage devices (e.g. an embedded storage device conforming to the SD/MMC, CF, MS, XD or UFS specification). According to this embodiment, the memory device 100 may comprise a controller such as a memory controller 110, and may further comprise a non-volatile (NV) memory 120, where the controller is arranged to access the NV memory 120, and the NV memory 120 is arranged to store information. The NV memory 120 may comprise at least one NV memory element (e.g. one or more NV memory elements), such as a plurality of NV memory elements 122-1, 122-2, ..., and 122-N, where the symbol "N" may represent an integer greater than 1. For example, the NV memory 120 may be a flash memory, and the NV memory elements 122-1, 122-2, ..., and 122-N may be a plurality of flash memory chips (which may be referred to as flash chips, for brevity) or a plurality of flash memory dies (which may be referred to as flash dies, for brevity), but the present invention is not limited thereto.

As shown in FIG. 1, the memory controller 110 may comprise a processing circuit such as a microprocessor 112, a storage such as a read only memory (ROM) 112M, a control logic circuit 114, a volatile memory 116 and a transmission interface circuit 118, where at least one portion (e.g. a portion or all) of these components maybe coupled to one another via a bus. The volatile memory 116 is implemented with a random access memory (RAM) (e.g. it may be a static RAM (SRAM)), but the present invention is not limited thereto. The volatile memory 116 maybe arranged to provide the memory controller 110 with internal storage space, for example, the memory controller 110 may temporarily store data. In addition, the ROM 112M of this embodiment is arranged to store a program code 112C, and the microprocessor 112 is arranged to execute the program code 112C in order to control access to the NV memory 120. Please note that the program code 112C may also be stored in the volatile memory 116 or in any type of memory. Additionally, the control logic circuit 114 may be arranged to control the NV memory 120. The control logic circuit 114 may comprise an error correction code (ECC) circuit (not shown) for protecting data and/or performing error correction, but the present invention is not limited thereto. The transmission interface circuit 118 may conform to a specific communications specification (e.g. the serial advanced technology attachment (SATA) specification, the Universal Serial Bus (USB) specification, the peripheral component interconnect express (PCIE) specification, the embedded multi media card (eMMC) specification, or the universal flash storage (UFS) specification), and may perform communications according to the specific communications specification.

In this embodiment, the host device 50 may access the NV memory 120 in the memory device 100, indirectly, by sending host commands and corresponding logical addresses to the memory controller 110. The memory controller 110 receives the host commands and the logical addresses, and translates the host commands to memory operating commands (simply called operating commands), and then controls the NV memory 120 to perform reading or writing/programming on memory units (e.g. data pages) having physical addresses within the NV memory 120 through the operating commands, where the physical addresses correspond to the logical addresses. When the memory controller 110 performs an erasing operation on any NV memory element 122-$n$ (e.g. the symbol "n" may represent any integer within the interval [1, N]) within the NV memory element 122-1, 122-2, ..., and 122-N, at least one block of multiple blocks of the NV memory element 122-$n$ will be erased, where each block of the multiple blocks may comprise multiple pages (such as data pages), and an access operation (e.g. reading or writing) may be performed on one or more pages.

Regarding block management of the NV memory 120, under control of the processing circuit such as the microprocessor 112, the memory controller 110 may store a global logical-to-physical (L2P) address mapping table in the NV memory 120, and maintain (e.g. change and/or update) the global L2P address mapping table. The global L2P address mapping table may comprise multiple local L2P address mapping tables, which may be referred to as L2P address mapping tables, for brevity, where any L2P address mapping table within the L2P address mapping tables may comprises multiple sets of L2P mapping information arranged for mapping logical addresses (e.g. addresses associated to host commands, arranged to access data stored in the NV memory 120) to physical addresses (e.g. addresses pointing to locations of stored data within the NV memory 120), and any set of the multiple sets of L2P mapping information may be mapping information arranged for mapping a logical address of a host command to a physical address of the NV memory 120. In addition, the memory controller 110 may store (e.g. load) at least one L2P address mapping table (e.g. one or more L2P address mapping tables) of the L2P address mapping tables into the volatile memory 116 as a temporary L2P address mapping table, and may maintain (e.g. change and/or update) the temporary L2P address mapping table. When needed, the memory controller 110 may update the global L2P address mapping table according to the temporary L2P address mapping table, but the present invention is not limited thereto. In some embodiments, the memory controller 110 may simply read the temporary L2P address mapping table when needed, rather than change and/or update the temporary L2P address mapping table according to the use of the NV memory 120, since the memory controller 110 may directly update the global L2P address mapping table according to the use of the NV memory 120.

For example, a first set of the multiple sets of L2P mapping information is mapping information arranged for mapping a first logical address to a first physical address, and a second set of the multiple sets of L2P mapping information is mapping information arranged for mapping a second logical address to a second physical address. According to some embodiments, implementation of the multiple sets of L2P mapping information may vary. For example, any set of the multiple sets of L2P mapping information may comprise a physical address, and within multiple physical addresses in the L2P address mapping table, the ranking of the physical address with respect to other physical addresses may represent a logical address, but the present invention is not limited thereto. For another example, any set of the multiple sets of L2P mapping information may comprise a logical address and a physical address.

II. Fast and Effective Recovery Architecture

Figure 2:
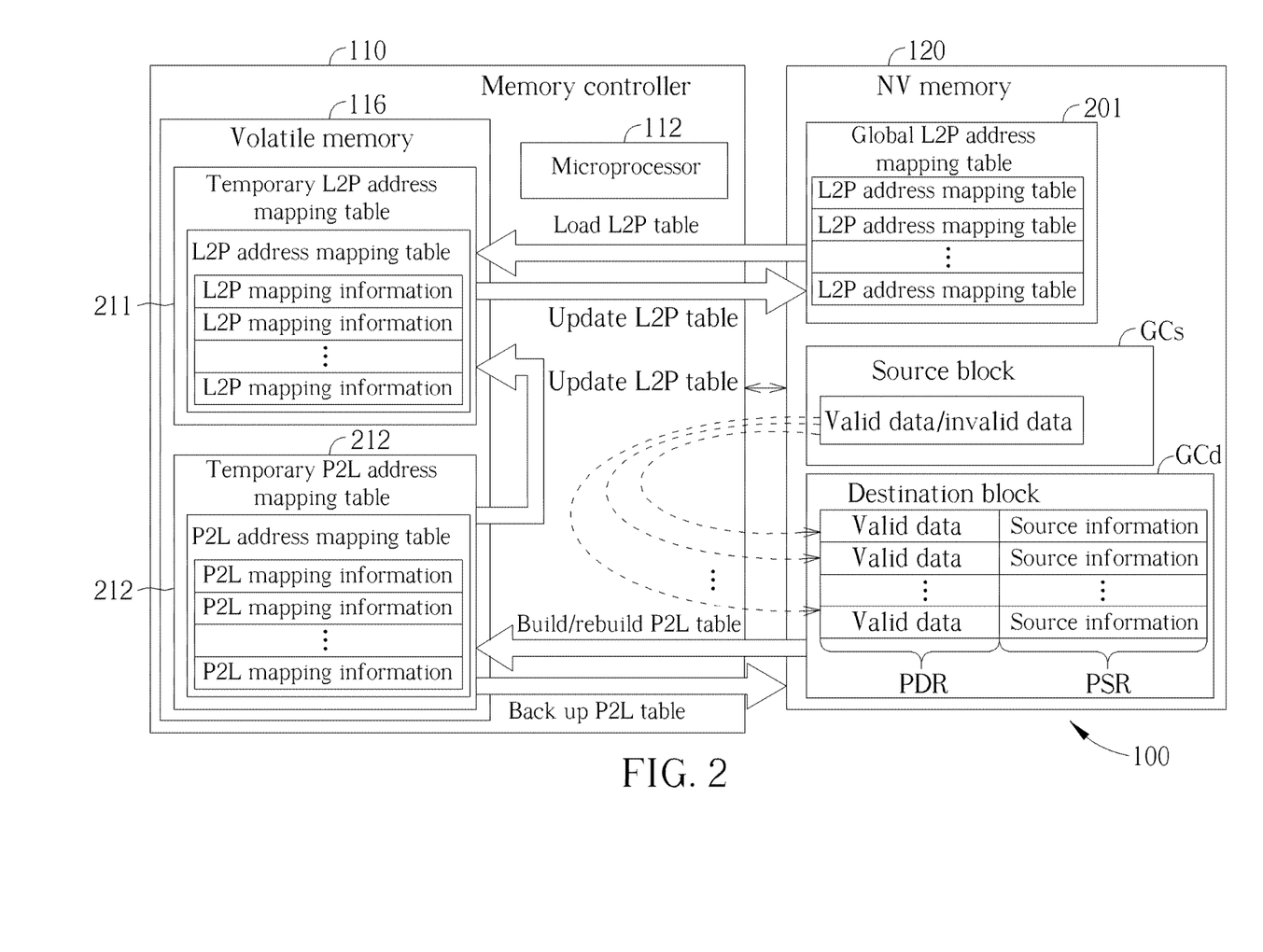
FIG. 2 is a diagram illustrating a method for reusing a destination block related to garbage collection (GC) in a memory device according to an embodiment of the present invention.

FIG. 2 is a diagram illustrating a method for reusing a destination block related to garbage collection (GC) in a memory device according to an embodiment of the present invention. The method maybe applied to the electronic device 10 and the memory device 100, and may be applied to the controller such as the memory controller 110, and more particularly, the processing circuit such as the microprocessor 112. A global L2P address mapping table 201 and a temporary L2P address mapping table 211 shown in the upper half of FIG. 2 may be taken as examples of the aforementioned global L2P address mapping table and the aforementioned temporary L2P address mapping table, respectively, where the memory controller 110 may load the aforementioned at least one L2P address mapping table as the temporary L2P address mapping table 211 (labeled "Load L2P table" in FIG. 2, for brevity), and may update the global L2P address mapping table 201 according to the temporary L2P address mapping table 211 (labeled "Update L2P table" in the upper half of FIG. 2, for brevity), but the present invention is not limited thereto. When performing a GC operation, the memory controller 110 operating based on the method may store valid data collected from one or more source blocks GCs into respective data regions PDR of multiple pages of one or more destination blocks GCd (e.g. a destination block GCd(0), which may be taken as an example of the destination block being reused), and may write respective source information of the aforementioned valid data, such as respective source locations of the aforementioned valid data, into respective spare regions PSR of the multiple pages, where a plurality of blocks within aforementioned at least one NV memory element (such as the plurality of NV memory elements 122-1, 122-2, ..., and 122-N) may comprise the one or more source blocks GCs and the one or more destination blocks GCd. For example, regarding data stored in a certain page of the one or more destination blocks GCd, the source location may be a certain source page of a certain source block within the one or more source blocks GCs. For better comprehension, the source information may comprise a block address and a page address, where the block address may represent this source block, the page address may represent this source page, and the block address and the page address may be logical block address and logical page address, respectively, but the present invention is not limited thereto.

In a normal situation such as that without sudden power-off occurring, the memory controller 110 may complete the GC operation of the one or more source blocks GCs, and may erase the one or more source blocks GCs for further use. In an abnormal situation such as that with sudden power-off occurring, a certain GC operation is not completed, and an operation of collecting valid data into the destination block GCd(0) is unexpectedly interrupted. In this situation, when the power is restored, the memory controller 110 may determine how to reuse the destination block GCd(0) according to the source information written into the spare region(s) of one or more pages of the one or more destination blocks GCd (more particularly, the destination block GCd(0)). For example, valid data of a certain source block GCs(W) within the one or more source blocks GCs that has already been collected to the destination block GCd(0) may be located in some data pages starting from the very beginning page (such as the $0^{th}$ to the $(Y-1)^{th}$ pages) within this source block GCs(W), and valid data that has not been collected to the destination block GCd(0) yet may be located in some other data pages within this source block GCs(W), where the symbol "W" may represent an integer greater than or equal to 0. The memory controller 110 may find the interruption location within this source block GCs(W) where the valid data collection is interrupted by the aforementioned sudden power-off (e.g. the location of the next page of the last page within these data pages from the very beginning page, such as the $Y^{th}$ page), to collect the valid data that has not been collected to the destination block GCd(0) from these other data pages to the destination block GCd(0), where the symbol "Y" may represent a natural number. In addition, the memory controller 110 may selectively perform a small portion of tasks that has previously completed in the GC operation again, to guarantee correctness of the data and/or the reliability of data storage (e.g. prevent any error directly or indirectly caused by the aforementioned sudden power-off event), but the present invention is not limited thereto. Based on the method, the memory controller 110 can quickly perform recovery regarding the GC mechanism, to reuse the destination block GCd(0). Therefore, problems existing in the related arts can be solved without greatly increasing the overall cost. In comparison with the related art, the present invention can improve performance of memory devices without introducing side effects or in a way that is less likely to introduce side effects.

Some implementation details regarding this quick and effective recovery architecture may be further described as follows. The memory controller 110 may store or manage (e.g. change and/or update) at least one physical-to-logical (P2L) address mapping table in the volatile memory 116, such as one or more P2L address mapping tables, which may be collectively called the temporary P2L address mapping table 212, and each P2L address mapping table therein (e.g. each of the one or more P2L address mapping tables) may comprise multiple sets of P2L mapping information arranged for mapping physical addresses to logical addresses, and any set of the multiple sets of the P2L mapping information may be mapping information arranged for mapping a physical address to a logical address. In the normal situation, when performing the GC operation of the one or more source blocks GCs, the memory controller 110 may record the respective source information of the aforementioned valid data (such as the respective source locations of the aforementioned valid data) in the temporary P2L address mapping table 212 to generate the multiple sets of P2L mapping information. In the abnormal situation, as information in the volatile memory 116 is lost when power is off, any P2L mapping information which has been recorded in the temporary P2L address mapping table 212 is lost. In this situation, the memory controller 110 may build or rebuild the aforementioned at least one P2L address mapping table such as the temporary P2L address mapping table 212 (labeled "Build/rebuild P2L table" in FIG. 2, for brevity) according to the source information of the respective spare regions of at least one portion (e.g. a portion or all) of pages within the multiple pages of the one or more destination blocks GCd (more particularly, the destination block GCd(0)) when power is recovered, for further use of the memory device 100. For example, the memory controller 110 may update the temporary L2P address mapping table 211 according to the temporary P2L address mapping table 212 (labeled "Update L2P table" at the arrow pointing toward the temporary L2P address mapping table 211 as shown in FIG. 2, for brevity), to update the global L2P address mapping table 201, indirectly, but the present invention is not limited thereto. For another example, the memory controller 110 may update the global L2P address mapping table 201, directly, according to the temporary P2L address mapping table 212. In addition, when needed, the memory controller 110 may back up the temporary P2L address mapping table 212 (labeled "Back up P2L table" in FIG. 2, for brevity), for example, backup the temporary P2L address mapping table 212 into certain page(s) of the destination block GCd(0), but the present invention is not limited thereto.

III. System Management

Figure 3:
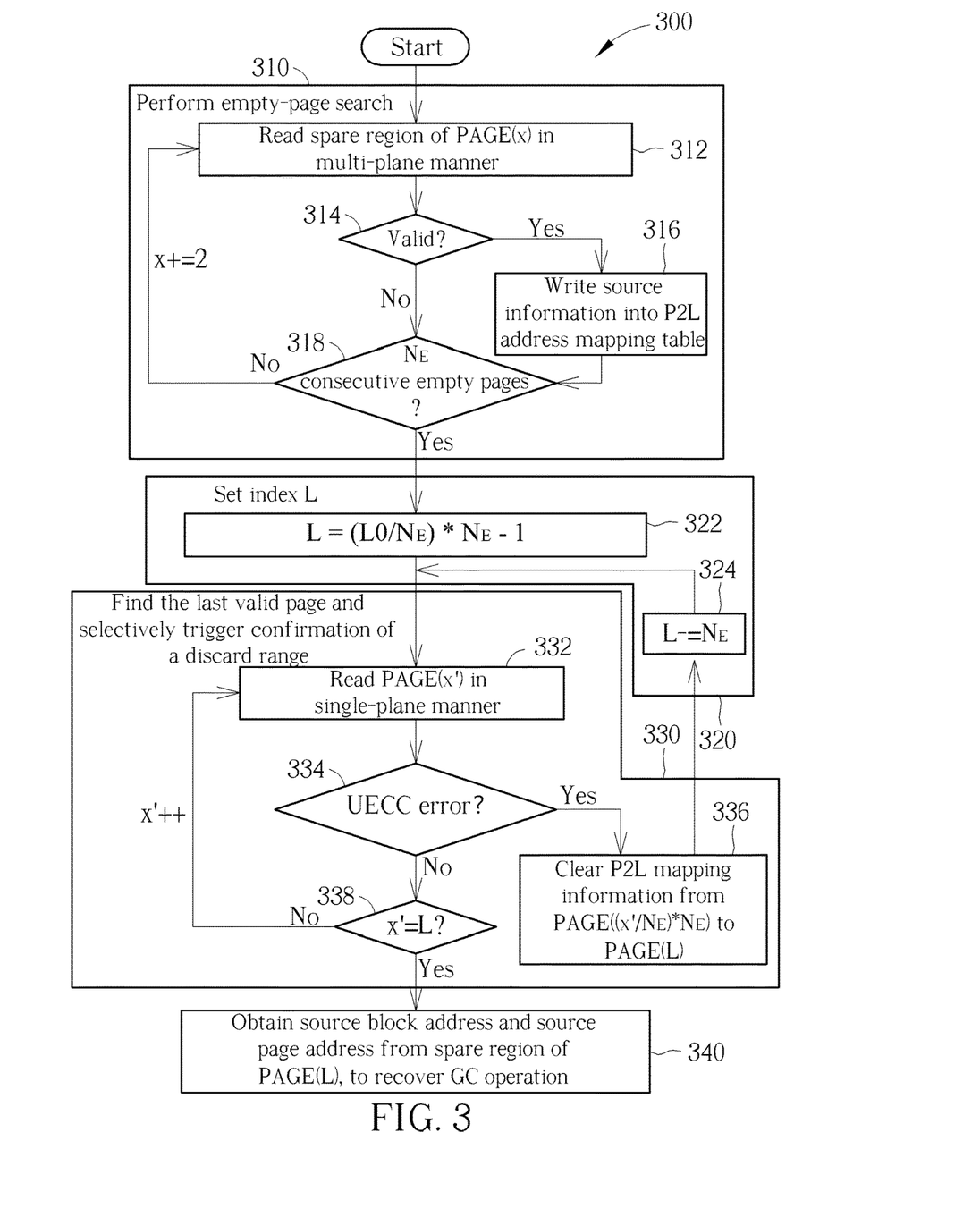
FIG. 3 is a working flow of the method according to an embodiment of the present invention.

FIG. 3 is a working flow 300 of the method according to an embodiment of the present invention. For example, under control of the processing circuit such as the microprocessor 112, the memory controller 110 may perform the steps of the working flow 300, to reuse the destination block such as the destination block GCd(0). For better comprehension, some steps illustrated in a step may be regarded as sub-steps of the step.

In Step 310, the memory controller 110 may perform empty-page search in the destination block GCd(0). According to this embodiment, the memory controller 110 may search starting from the beginning of the destination block GCd(0) (e.g. read one page for every predetermined count of pages to check whether it is an empty page), until $N_E$ consecutive empty pages are found, but the present invention is not limited thereto. In addition, at the beginning of Step 310 (e.g. before executing Step 312), the memory controller 110 may set the index x of the page PAGE(x) mentioned in Step 312 to an initial value x0. For example, the beginning of the destination block GCd(0) may be the page PAGE(0), and x0=1, but the present invention is not limited thereto.

In Step 312, the memory controller 110 may read the spare region of the page PAGE(x) in a multi-plane manner, where a multi-plane flash memory may be taken as an example of the NV memory 120, and reading in the multi-plane manner may increase the speed of the empty-page search, but the present invention is not limited thereto.

In Step 314, the memory controller 110 may check whether the page PAGE(x) is valid. According to the content of the spare region of the page PAGE(x), the memory controller 110 may determine whether the page PAGE(x) is valid. When the spare region of the page PAGE(x) is not blank (e.g. information such as source information exists in the spare region), and no uncorrectable ECC (UECC) error of the spare region occurs, the memory controller 110 may determine that the page PAGE(x) is valid; otherwise, the memory controller 110 may determine the page PAGE(x) as an empty page, which means the page PAGE(x) is not valid. When the page PAGE(x) is valid, Step 316 is entered; otherwise, Step 318 is entered.

In Step 316, the memory controller 110 may write the source information into a P2L address mapping table (such as the P2L address mapping table shown in FIG. 2), to build or rebuild the P2L address mapping table, where the source information in Step 316 may be utilized as a set of P2L mapping information of the P2L address mapping table. In a situation where Step 316 is entered multiple times, the operation of Step 316 may be executed multiple times, and the memory controller 110 may write the corresponding source information into the P2L address mapping table, respectively (e.g. starting from the top thereof), to be a portion of P2L mapping information within the P2L address mapping table.

In Step 318, the memory controller 110 may check whether $N_E$ consecutive empty pages are found. When $N_E$ consecutive empty pages are found, Step 320 is entered; otherwise, Step 312 is entered, where the memory controller 110 may increase the index x with an increment Δx such as 2 (labeled "x+=2", for better comprehension), but the present invention is not limited thereto.

According to this embodiment, the predetermined count may be proportional to the increment Δx, more particularly, may be equal to the increment Δx or a multiple thereof. In addition, "$N_E$" may represent a predetermined page count. For example:

$$N_E=(\text{Memory\_cell\_bit\_count}*\text{MultiPlane});$$

where "Memory_cell_bit count" may represent a memory cell bit count, such as the number of bit(s) that each transistor used as a memory cell within the NV memory 120 can store, and "MultiPlane" may represent a plane count of the multi-plane flash memory. For better comprehension, the NV memory 120 may be a multiple level cell (MLC) flash memory and may be the multi-plane flash memory, where Memory_cell_bit_count=2 and MultiPlane=2, which may cause that $N_E=(2*2)=4$, but the present invention is not limited thereto.

In Step 320, the memory controller 110 may set an index L. For example, a page PAGE(L0) within the destination block GCd(0) may represent a certain page written by the memory controller 110 in an interrupted one-shot programming operation; where the symbol "L0" may represent a natural number. Through the aforementioned empty-page search, the memory controller 110 may determine that the page PAGE(0) to the page PAGE(L0) within the destination block GCd(0) are valid. For better comprehension, assume that $L0 \geq N_E$. In Step 322, the memory controller 110 may set the index L according to the following equation:

$$L=(L0/N_E)*N_E-1;$$

where the calculation result of the ($L0/N_E$) calculation may be a simplified calculation result, to make (($L0/N_E$)*$N_E$) be equal to a maximum of the numbers that are not greater than L0 within the multiples of $N_E$. The page PAGE(L) at this moment may represent the last page written by the memory controller 110 in the previous one-shot programming operation before the interrupted one-shot programming operation. For example, L0=24 and $N_E$=4, which may cause that L=((24/4)*4)−1=23, where L=23 may make the index L point to the page PAGE(23) of the destination block GCd(0), but the present invention is not limited thereto.

In addition, when the operation of Step 324 is triggered, the memory controller 110 may adjust the index L in Step 324, more particularly, decrease the index L by $N_E$ (labeled "L-=$N_E$", for better comprehension).

In Step 330, the memory controller 110 may find the last valid page within the destination block GCd(0) and selectively trigger confirmation of a discard range, for discarding the discard range. At the beginning of Step 330 (e.g. before executing Step 332), the memory controller 110 may set the index x' of the page PAGE(x') mentioned in Step 332 according to a function f(L, $N_E$), to make x'=f(L, $N_E$). For example, f(L, $N_E$) may be equal to (L−$N_E$+1), where x'=(L−$N_E$+1), but the present invention is not limited thereto.

In Step 332, the memory controller 110 may read the page PAGE(x') in a single-plane manner.

In Step 334, the memory controller 110 may check whether any UECC error of the page PAGE(x') occurs. The memory controller 110 may decode data obtained from the data region of the page PAGE(x'), more particularly, may perform ECC decoding on the data. When the UECC error occurs, Step 336 is entered; otherwise (for example, no error occurs; for another example, an error does occur, but the error has been corrected), Step 338 is entered.

In Step 336, the memory controller 110 may clear the P2L mapping information from the page PAGE((x'/$N_E$)*$N_E$) to the page PAGE(L) within the P2L address mapping table, where the discard range may comprise these pages, and the calculation result of the (x'/$N_E$) calculation may be a simplified calculation result, to make ((x'/$N_E$)*$N_E$) be equal to a maximum of the numbers that are not greater than x' within the multiples of $N_E$, such as (L−$N_E$+1). For example, in a situation where $N_E$=4 and L=23, no matter whether x' is equal to 21, 22 or 23, ((x'/$N_E$)*$N_E$) may be equal to 20, so the memory controller 110 may clear the P2L mapping information from page PAGE(20) to page PAGE(23) within the P2L address mapping table. As the indexes x' and L may vary in the working flow 300, executing Step 324 one time means the discard range may reach $N_E$ pages, executing Step 324 two times means the discard range may reach ($N_E$*2) pages, and so on, but the present invention is not limited thereto. Afterward, Step 324 is entered to trigger confirmation of the discard range, for discarding the discard range.

In Step 338, the memory controller 110 may check whether x'=L. When x'=L, Step 340 is entered; otherwise, Step 332 is entered, where the memory controller 110 may increase the index x' by 1 (labeled "x'++"for better comprehension).

In Step 340, the memory controller 110 may obtain a certain source block address (such as the block address of the source block GCs(W)) and a certain source page address (such as the page address of a certain page within the source block GCs(W)) from the spare region of the page PAGE(L) of the destination block GCd(0), to recover the GC operation. As a result, the memory controller 110 may collect subsequent valid data of the source block GCs(W), and may write the corresponding source information into the P2L address mapping table, to be a subsequent portion of P2L mapping information within the P2L address mapping table.

According to this embodiment, the memory controller 110 may discard the fractional part in the ($L0/N_E$) calculation in Step 322 (e.g. L0 and $N_E$ are both integers, and the quotient generated by the (L0/$N_E$) calculation is an integer), and may discard the fractional part in the (x'/$N_E$) calculation in Step 336 (e.g. x' and $N_E$ are both integers, and the quotient generated by the (x'/$N_E$) calculation is an integer), but the present invention is not limited thereto. In addition, for better comprehension, it can be assumed that L0≥$N_E$ in Step 336, but the present invention is not limited thereto. When L0<$N_E$, L=−1; which means: the interrupted one-shot programming operation is the first one-shot programming operation when the memory controller 110 writes the destination block GCd(0) in the beginning. In this situation, the memory controller 110 may find a previous destination block from the destination block GCd (such as the destination block just utilized before utilizing the destination block GCd(0)), and obtain a certain source block address (such as the block address of the source block GCs(W)) and a certain source page address (such as the page address of a certain page within the source block GCs(W)) from the spare region of the last data page (such as the page PAGE(Lmax), where the symbol "Lmax" may represent the page number of the last data page) of the previous destination block, to recover the GC operation. As a result, the memory controller 110 may continue utilizing the destination block GCd(0) to collect the subsequent valid data of the source block GCs(W), and may write the corresponding source information into the P2L address mapping table, to rebuild the P2L address mapping table.

According to some embodiments, the type of the NV memory 120 may vary. For example, the NV memory 120 may be a single level cell (SLC) flash memory and Memory_cell_bit_count=1. For another example, the NV memory may be a triple level cell (TLC) flash memory and Memory_cell_bit_count=3. According to some embodiments, the NV memory 120 may be a single-plane flash memory and MultiPlane=1, and the memory controller 110 may read the spare region of the page PAGE(x) in the single-plane manner in Step 312. According to some embodiments, implementation of programming the destination block GCd(0) may vary. For example, the memory controller 110 does not need to write the destination block GCd(0) in the one-shot programming manner, where the equation in Step 322 may vary, correspondingly. According to some embodiments, the initial value x0 and/or the increment Δx in Step 310 may vary, where examples of implementation details thereof may include, but are not limited to:

x0=2 and Δx=3 (e.g. "x+=2" is replaced with "x+=3");

x0=3 and Δx=4 (e.g. "x+=2" is replaced with "x+=4"); . . .

x0=0 and Δx=2;

x0=0 and Δx=3 (e.g. "x+=2" is replaced with "x+=3");

x0=0 and Δx=4 (e.g. "x+=2" is replaced with "x+=4"); . . . .

According to some embodiments, the search method in the operation of Step 310 may vary. For example, the memory controller 110 may perform empty-page search in the destination block GCd(0) according to the binary search method, to find the last valid page within the destination block GCd(0). For another example, the memory controller 110 may perform empty-page search in the destination block GCd(0) according to any other search method, to find the last valid page within the destination block GCd(0). According to some embodiments, the index x of the page PAGE(x) and the index x' of the page PAGE(x') may represent the page addresses (such as logical page addresses). For example, these page addresses may be hexadecimal values or binary values, but the present invention is not limited thereto.

According to some embodiments, the method may comprise: finding the last valid page within the destination block GCd(0) and selectively triggering confirmation of the discard range, for discarding the discard range (Step 330); obtaining the source block address and the source page address from the spare region of the page PAGE(L) within the destination block GCd(0) (Step 340); rebuilding the P2L address mapping table, starting from the beginning to the end thereof, where the P2L mapping information therein may correspond to (e.g. may be equivalent to) the source information from the very beginning page to the last page within the destination block GCd(0); when confirmation of the discard range is triggered for discarding the discard range, programming dummy pages in the destination block GCd(0), more particularly, programming the dummy pages in the discard range, and clearing the P2L mapping information corresponding to the discard range in the P2L address mapping table, where the discard range may comprise all pages within a word-line group, and the word-line group may comprise one or more word-lines; collecting the subsequent valid data within the source block GCs(W), and writing the corresponding source information into the P2L address mapping table, to be the subsequent portion of P2L mapping information within the P2L address mapping table.

Figure 4:
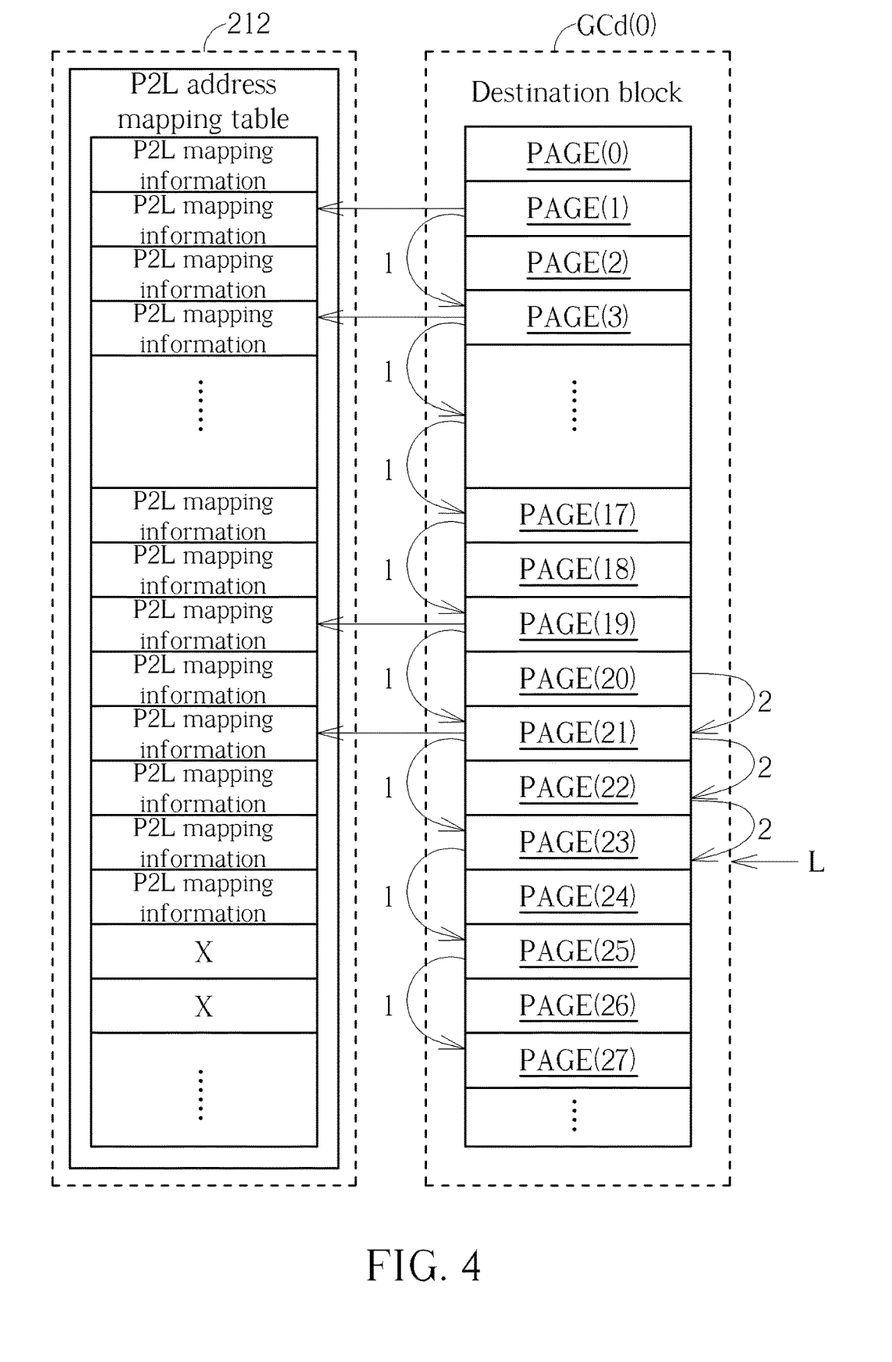
FIG. 4 illustrates a control scheme of the working flow shown in FIG. 3 according to an embodiment of the present invention.

FIG. 4 illustrates a control scheme of the working flow 300 shown in FIG. 3 according to an embodiment of the present invention. The P2L address mapping table shown in the left half of FIG. 4 may be taken as an example of the P2L address mapping table mentioned in Step 316, where the symbol "X" may represent predetermined information, such as 0xFFFFFFFF; and the destination block GCd(0) shown in the right half of FIG. 4 may comprise pages {PAGE(0), PAGE(1), PAGE(2), PAGE(3), . . . , PAGE(17), PAGE(18), PAGE(19), PAGE(20), PAGE(21), PAGE(22), PAGE(23), PAGE(24), PAGE(25), PAGE(26), PAGE(27), . . . }, where the symbol "1" and "2" (labeled at the associated arrows in FIG. 4) may represent the operation of Step 310 and the operation of Step 330, respectively; but the present invention is not limited thereto. For example, the pages previously written by the memory controller 110 into the destination block GCd(0) (in the interrupted GC operation) may comprise the pages {PAGE(0), PAGE(1), . . . , PAGE(24)}, and the pages {PAGE(20), PAGE(21), PAGE(22), PAGE(23)} may belong to the same word-line group. For better comprehension, assume that the index L corresponds to (e.g. points toward) the page PAGE(23) at a certain time point. Based on the working flow 300, the memory controller 110 may find the last valid page within the destination block GCd(0) and selectively trigger confirmation of the discard range, for discarding the discard range. For brevity, similar descriptions for this embodiment are not repeated in detail here.

According to some embodiments, at the beginning of the GC operation, before the memory controller 110 fills the P2L mapping information into the P2L address mapping information, the memory controller 110 may fill the predetermined information (such as 0xFFFFFFFF) into each field of the P2L address mapping table. For example, the predetermined information in a field may indicate that the field is in an unused state. In addition, during recovering the GC operation, when needed, the memory controller 110 may clear the P2L mapping information of a certain field, more particularly, may forcibly fill the predetermined information into this field, to indicate that it is in the unused state. According to some embodiments, the content and/or the bit count of the predetermined information may vary.

Figure 5:
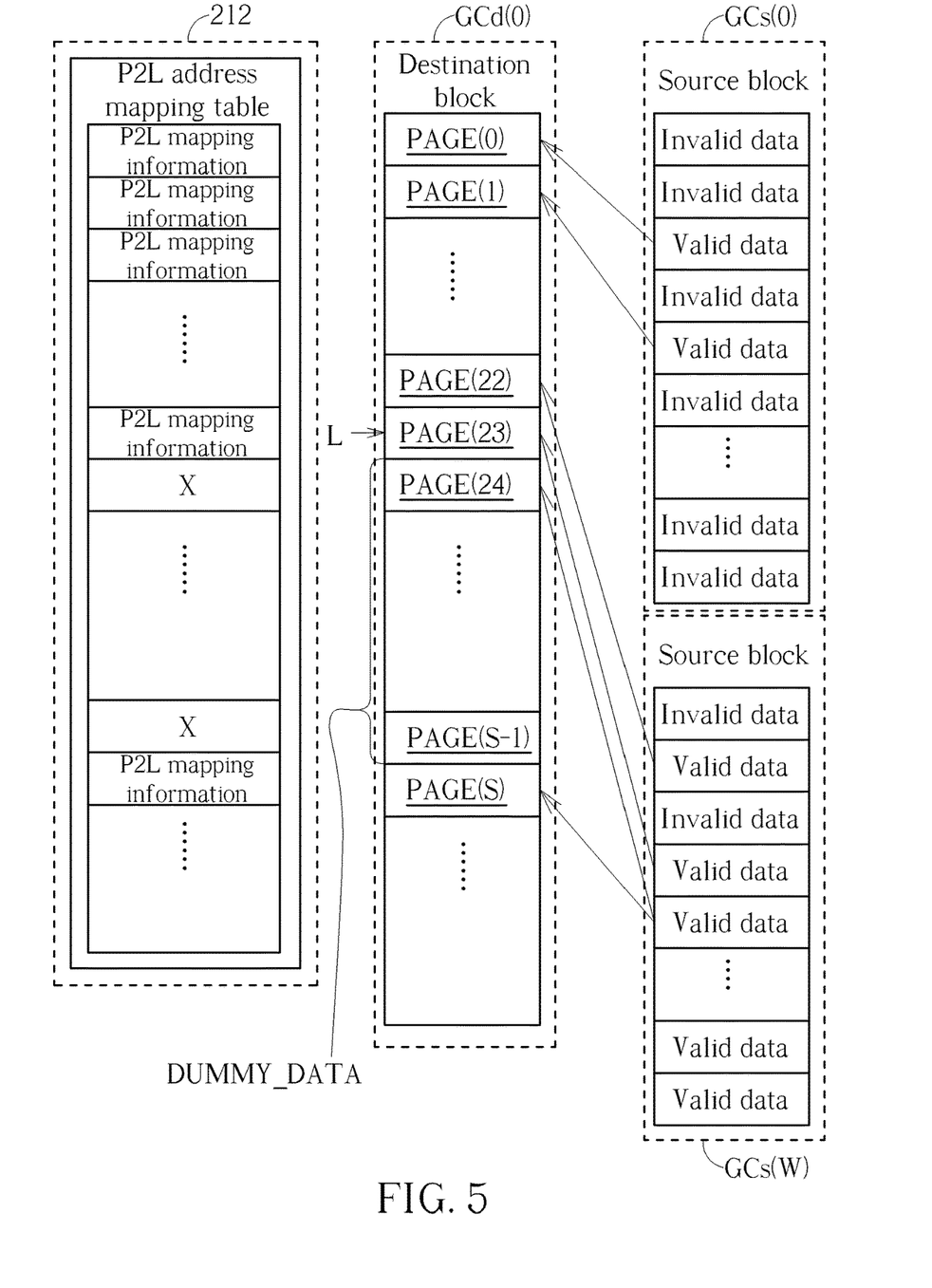
FIG. 5 illustrates a control scheme of the working flow shown in FIG. 3 according to an embodiment of the present invention.

FIG. 5 illustrates a control scheme of the working flow 300 shown in FIG. 3 according to an embodiment of the present invention. For example, the pages previously written by the memory controller 110 into the destination block GCd(0) (in the interrupted GC operation) may comprise the pages {PAGE(0), PAGE(1), . . . , PAGE(24)}, where the memory controller 110 has stored multiple sets of valid data obtained from the source block GCs(0) and GCs(W) into the pages {PAGE(0), PAGE(1), . . . , PAGE(24)}, respectively, and ignored multiple sets of invalid data of the source block GCs(0) and GCs(W). According to this embodiment, the discard range may comprise the page PAGE(24), more particularly, may comprise the pages {PAGE(24), . . . , PAGE(S-1)}. The memory controller 110 may write dummy data DUMMY_DATA into the discard range to make the pages {PAGE(24), . . . , PAGE(S-1)} become dummy pages, and may clear the corresponding source information in the P2L address mapping table, for example, forcibly fill the predetermined information (such as 0xFFFFFFFF) into the fields to be cleared, where in the P2L address mapping table shown in FIG. 5, those labeled "X" may indicate cleared fields, but the present invention is not limited thereto. As the page PAGE(24) is located in the discard range, the data of the page PAGE(24) may be regarded as discarded data. The source information within the spare region of the page PAGE(23) may comprise the page address of a certain page within the source block GCs(W). For example, this page may be the $(Y-1)^{th}$ page of the source block GCs(W), which means that continuing the task of valid data collection should start from the next page (such as the $Y^{th}$ page). The memory controller 110 may collect the subsequent valid data within the source block GCs(W), and may write the corresponding source information into the P2L address mapping table, to be the subsequent portion of P2L mapping information within the P2L address mapping table. For example, the memory controller 110 may read the $Y^{th}$ page of the source block GCs(W) to regain this set of valid data therein and write this set of valid data into the page PAGE(S) of the destination block GCd(0), and may write the corresponding source information into the P2L address mapping table. For brevity, similar descriptions for this embodiment are not repeated in detail here.

Figure 6:
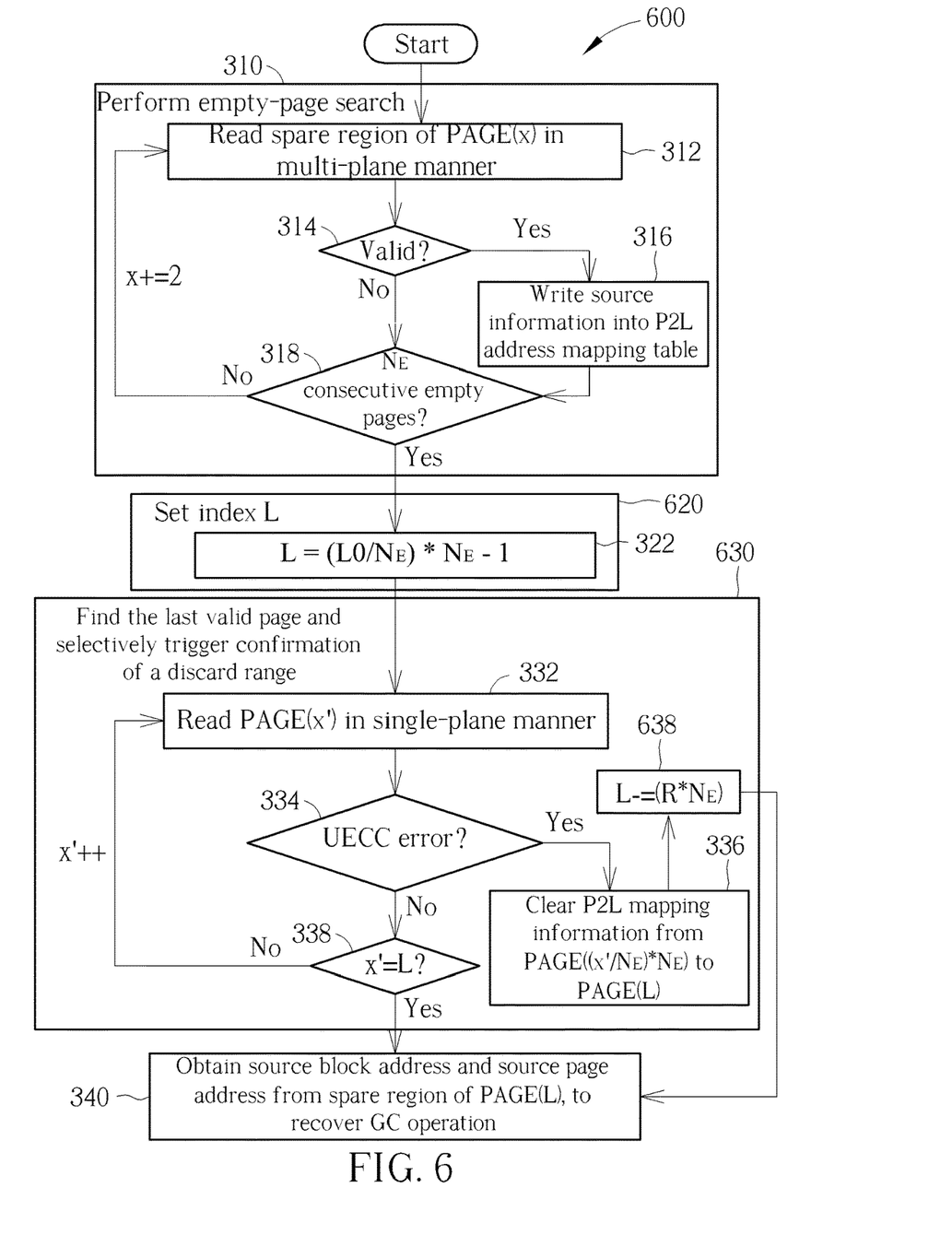
FIG. 6 is a working flow of the method according to another embodiment of the present invention.

FIG. 6 is a working flow 600 of the method according to another embodiment of the present invention. For example, under control of the processing circuit such as the microprocessor 112, the memory controller 110 may perform the steps in the working flow 600, to reuse the destination block such as the destination block GCd(0). In comparison with the working flow 300 shown in FIG. 3, Step 638 is added and Step 324 is removed in this embodiment, and after executing Step 336, Step 638 is entered, and then Step 340 is entered. In response to these changes, Steps 320 and 330 may become Step 620 and 630 of the working flow 600, respectively. When the operation of Step 638 is triggered, the memory controller 110 may adjust the index L in Step 638, more particularly, decrease the index L by $(R*N_E)$ (labeled "L-=(R*NE)", for better comprehension), where the symbol "R" may represent a predetermined value, such as a positive integer. For example, R=1. For another example, R may be any other positive integer. For brevity, similar descriptions for this embodiment are not repeated in detail here.

Figure 7:
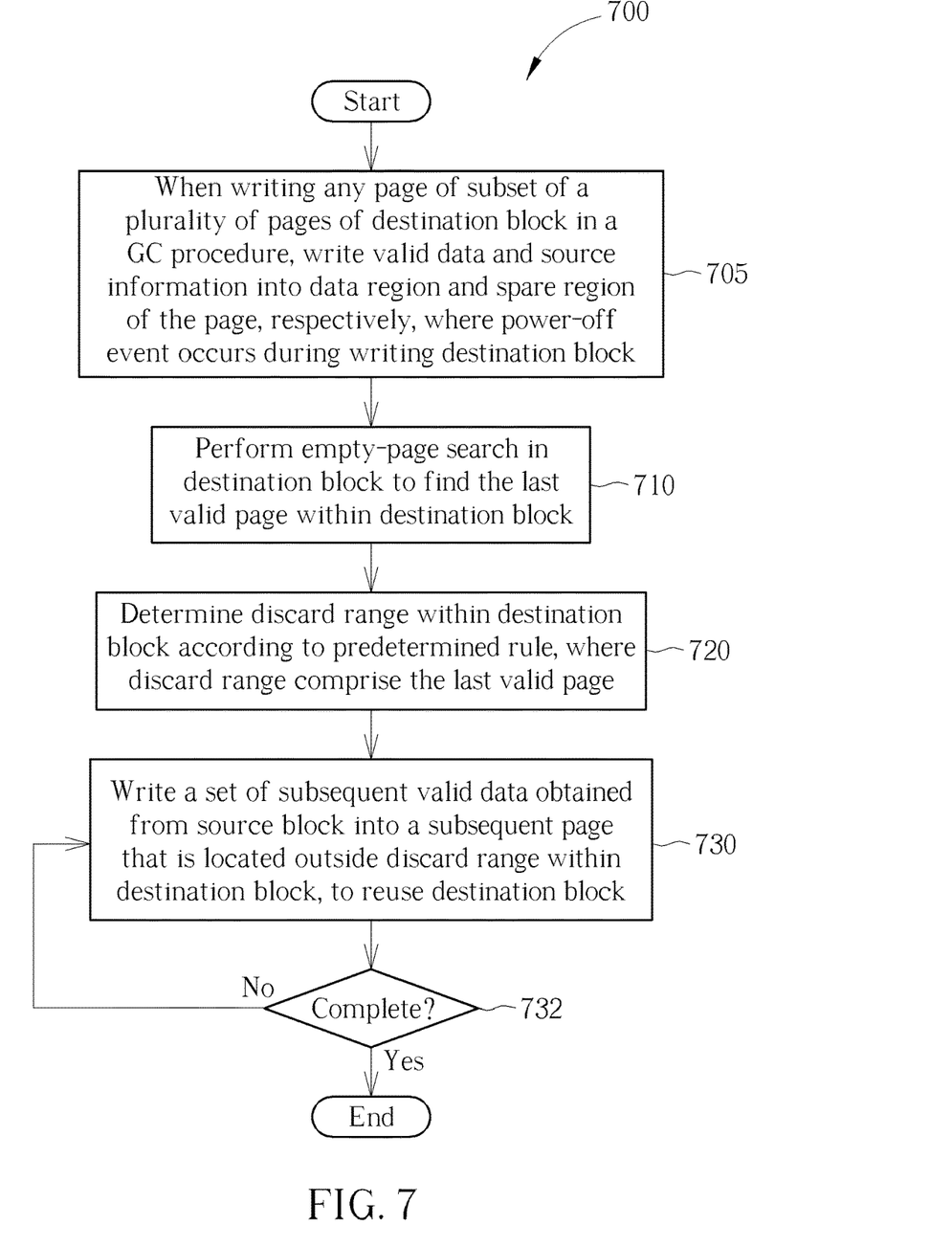
FIG. 7 is a working flow of the method according to another embodiment of the present invention.

FIG. 7 is a working flow 700 of the method according to another embodiment of the present invention. For example, under control of the processing circuit such as the microprocessor 112, the memory controller 110 may perform the steps in the working flow 700, to reuse the destination block such as the destination block GCd(0).

In Step 705, when writing any page of a subset of a plurality of pages of the destination block GCd(0) in a GC procedure, the memory controller 110 may write valid data and source information into the data region PDR and the spare region PSR of the page, respectively, where a power-off event occurs during writing the destination block GCd (0), and the source information indicates a source location of the valid data. According to this embodiment, the source location maybe located in a certain block within the one or more source blocks GCs (for example, the source block GCs(0); for another example, the source block GCs(W)), more particularly, may be located in a certain page within this source block. The power-off event interrupts the valid data collection of the memory device 100 from the source block GCs(W) to the destination block GCd(0). For example, before the power-off event begins, the memory device 100 (e.g. the memory controller 110) is writing a certain set of valid data obtained from the source block GCs(W) into the destination block GCd(0), more particularly, is copying this set of valid data from the source block GCs(W) to the destination block GCd(0). After the power-off even ends, Step 710 is entered.

In Step 710, the memory controller 110 may perform empty-page search in the destination block GCd(0) to find the last valid page within the destination block GCd(0). For example, the memory controller 110 may perform empty-page search equivalent or similar to that of Step 310, to find the last valid page, where the initial value x0 and/or the increment Δx may vary. For another example, the memory controller 110 may perform empty-page search in the destination block GCd(0) according to the binary search method or any other search method, to find the last valid page within the destination block GCd(0).

In Step 720, the memory controller 110 may determine a discard range within the destination block GCd(0) (such as the aforementioned discard range) according to a predetermined rule, where the discard range may comprise the last valid page. For example, the predetermined rule may indicate a size of the discard range. According to this embodiment, the memory controller 110 may write dummy data (such as the aforementioned dummy data DUMMY DATA) into the discard range.

In Step 730, the memory controller 110 may write a set of subsequent valid data obtained from the source block GCs (W) into a subsequent page that is located outside the discard range within the destination block GCd(0), to reuse the destination block GCd(0). The last valid page and the subsequent page may belong to different word-lines, respectively. For example, the subset of the plurality of pages of the destination block GCd(0) may correspond to at least one first word-line (such as one or more first word-lines), and the subset may comprise the last valid page. For another example, another subset of the plurality of pages of the destination block GCd(0) may correspond to at least one second word-line (such as one or more second word-lines), and the aforementioned another subset may comprise the subsequent page.

In Step 732, the memory controller 110 may check whether operations regarding reusing the destination block GCd(0) are completed. When these operations are completed, the working flow 700 ends; otherwise, Step 730 is entered.

According to this embodiment, through the loop formed with Step 730 and Step 732, the memory controller 110 may write multiple sets of subsequent valid data obtained from the source block GCs(W) into multiple subsequent pages within the destination block GCd(0), respectively, to complete the GC procedure, where the multiple sets of subsequent valid data comprise the set of subsequent data, and the multiple subsequent pages comprise the subsequent page. More particularly, the multiple sets of valid data may be written into the respective data regions PDR of the multiple subsequent pages, respectively. When writing the multiple sets of subsequent valid data into the multiple subsequent pages, the memory controller 110 may write multiple sets of source information into the respective spare regions PSR of the multiple subsequent pages, where the multiple sets of source information indicate the respective source locations of the multiple sets of subsequent valid data. In addition, according to the source information of the respective spare regions PSR of at least one portion of pages within the plurality of pages (e.g. a portion or all of the plurality of pages) of the destination block GCd(0), the memory controller 110 may rebuild the aforementioned at least one P2L address mapping table for further use of the memory device 100. For brevity, similar descriptions for this embodiment are not repeated in detail here.

According to some embodiments, the memory controller 110 may identify the discard range within the destination block GCd(0), where the discard range comprises the last valid page. For example, the discard range may correspond to at least one word-line (such as one or more word-lines). As a result, the memory controller 110 may prevent any error directly or indirectly caused by the sudden power-off event. For brevity, similar descriptions for these embodiments are not repeated in detail here.

According to some embodiments, the predetermined rule may correspond to at least one (e.g. one or more) of a brand and a model of the aforementioned at least one NV memory element. When the aforementioned at least one of the brand and the model of the aforementioned at least one NV memory element varies, the predetermined rule may vary, to make the size of the discard range correspond to some other brand and/or other model. For example, when the aforementioned at least one NV memory element is replaced with other NV memory element(s), (such as the NV memory elements of the other brand and/or the other model), the size of the discard rage may become bigger or smaller, to conform to characteristics of the aforementioned other NV memory element(s) (such as the characteristic of whether it is prone to data error). For brevity, similar descriptions for these embodiments are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for reusing a destination block related to garbage collection (GC) in a memory device, the memory device comprising a non-volatile (NV) memory, the NV memory comprising at least one NV memory element, the method comprising:

when writing any page of a subset of a plurality of pages of the destination block in a GC procedure, writing valid data and source information into a data region and a spare region of the page, respectively, wherein a power-off event occurs during writing the destination block, the source information indicates a source location of the valid data, the source location is located in one or more source blocks, the power-off event interrupts valid data collection of the memory device from a source block of the one or more source blocks to the destination block, and a plurality of blocks within the at least one NV memory element comprises the one or more source blocks and the destination block;

after the power-off event ends, performing empty-page search in the destination block to find a last valid page within the destination block; and writing a set of subsequent valid data obtained from the source block into a subsequent page within the destination block to reuse the destination block.

2. The method of claim 1, further comprising:
selectively triggering confirmation of a discard range within the destination block, for discarding the discard range, wherein the discard range comprises the last valid page;
wherein the step of writing the set of subsequent valid data obtained from the source block into the subsequent page within the destination block to reuse the destination block further comprises:
writing the set of subsequent valid data into the subsequent page that is located outside the discard range within the destination block.

3. The method of claim 1, further comprising:
determining a discard range within the destination block according to a predetermined rule, wherein the discard range comprises the last valid page;
wherein the step of writing the set of subsequent valid data obtained from the source block into the subsequent page within the destination block to reuse the destination block further comprises:
writing the set of subsequent valid data into the subsequent page that is located outside the discard range within the destination block.

4. The method of claim 3, wherein the predetermined rule indicates a size of the discard range.

5. The method of claim 1, further comprising:
identifying a discard range within the destination block, wherein the discard range comprises the last valid page.

6. The method of claim 5, wherein the discard range corresponds to at least one word-line.

7. The method of claim 1, further comprising:
writing dummy data into a discard range within the destination block, wherein the discard range comprises the last valid data;
wherein the step of writing the set of subsequent valid data obtained from the source block into the subsequent page within the destination block to reuse the destination block further comprises:
writing the set of subsequent valid data into the subsequent page that is located outside the discard range within the destination block.

8. The method of claim 1, wherein the last valid page and the subsequent page belong to different word-lines, respectively.

9. The method of claim 1, wherein the subset of the plurality of pages of the destination block corresponds to at least one first word-line, and the subset comprises the last valid page.

10. The method of claim 9, wherein another subset of the plurality of pages of the destination block corresponds to at least one second word-line, and the another subset comprises the subsequent page.

11. The method of claim 1, wherein the source information comprises a block address and a page address.

12. The method of claim 1, further comprising:
writing multiple sets of subsequent valid data obtained from the source block into multiple subsequent pages within the destination block, respectively, to complete the GC procedure, wherein the multiple sets of subsequent valid data comprise the set of subsequent data, and the multiple subsequent pages comprise the subsequent page.

13. The method of claim 12, wherein the multiple sets of subsequent valid data are written into respective data regions of the multiple subsequent pages; and the method further comprises:
when writing the multiple sets of subsequent valid data into the multiple subsequent pages, writing multiple sets of source information into respective spare regions of the multiple subsequent pages, wherein the multiple sets of source information indicate respective source locations of the multiple sets of subsequent valid data.

14. The method of claim 1, further comprising:
rebuilding a physical-to-logical address mapping table according to the source information of respective spare regions of at least one portion of pages within the plurality of pages of the destination block for further use of the memory device.

15. A memory device, comprising:
a non-volatile (NV) memory, arranged for storing information, wherein the NV memory comprises at least one NV memory element; and
a controller, coupled to the NV memory, arranged for controlling at least one operation of the memory device, wherein the controller comprises:
a processing circuit, arranged for controlling the controller according to a command from a host device, to allow the host device to access the NV memory through the controller, wherein under control of the processing circuit, the controller performs following operations:
when writing any page of a subset of a plurality of pages of a destination block in a garbage collection (GC) procedure, writing valid data and source information into a data region and a spare region of the page, respectively, wherein a power-off event occurs during writing the destination block, the source information indicates a source location of the valid data, the source location is located in one or more source blocks, the power-off event interrupts valid data collection of the memory device from a source block of the one or more source blocks to the destination block, and a plurality of blocks within the at least one NV memory element comprises the one or more source blocks and the destination block;
after the power-off event ends, performing empty-page search in the destination block to find a last valid page within the destination block; and
writing a set of subsequent valid data obtained from the source block into a subsequent page within the destination block to reuse the destination block.

16. The memory device of claim 15, wherein the controller selectively triggers confirmation of a discard range within the destination block, for discarding the discard range, wherein the discard range comprises the last valid page; and the controller writes the set of subsequent valid data into the subsequent page that is located outside the discard range within the destination block.

17. The memory device of claim 15, wherein the controller determines a discard range within the destination block according to a predetermined rule, wherein the discard range comprises the last valid page; and the controller writes the set of subsequent valid data into the subsequent page that is located outside the discard range within the destination block.

18. The memory device of claim 15, wherein the last valid page and the subsequent page belong to different word-lines, respectively.

19. An electronic device, comprising the memory device of claim 15, and further comprising:
the host device, coupled to the memory device, wherein the host device comprises:
at least one processor, arranged for controlling operations of the host device; and
a power supply circuit, coupled to the at least one processor, arranged for supplying power to the at least one processor and the memory device;
wherein the memory device is arranged for providing storage space to the host device.

20. A controller of a memory device, the memory device comprising the controller and a non-volatile (NV) memory, the NV memory comprising at least one NV memory element, the controller comprising:
a processing circuit, arranged for controlling the controller according to a command from a host device, to allow the host device to access the NV memory through the controller, wherein under control of the processing circuit, the controller performs following operations:
when writing any page of a subset of a plurality of pages of a destination block in a garbage collection (GC) procedure, writing valid data and source information into a data region and a spare region of the page, respectively, wherein a power-off event occurs during writing the destination block, the source information indicates a source location of the valid data, the source location is located in one or more source blocks, the power-off event interrupts valid data collection of the memory device from a source block of the one or more source blocks to the destination block, and a plurality of blocks within the at least one NV memory element comprises the one or more source blocks and the destination block;
after the power-off event ends, performing empty-page search in the destination block to find a last valid page within the destination block; and
writing a set of subsequent valid data obtained from the source block into a subsequent page within the destination block to reuse the destination block.

* * * * *